United States Patent [19]
Wise et al.

[11] Patent Number: 5,352,938
[45] Date of Patent: Oct. 4, 1994

[54] ANALOG TO DIGITAL SIGNAL CONVERSION

[75] Inventors: William D. Wise, Flora; Larry R. Hach, Kokomo; Clifford L. Carpenter, Greentown, all of Ind.

[73] Assignee: Delco Electronics Corporation, Kokomo, Ind.

[21] Appl. No.: 993,764

[22] Filed: Dec. 14, 1992

[51] Int. Cl.⁵ .............................................. H03K 5/24
[52] U.S. Cl. .................................. 307/358; 307/351; 307/352; 307/494; 307/491
[58] Field of Search ............... 307/351, 354, 358, 359, 307/360, 491, 494; 341/139, 155; 377/24.1, 28, 42

[56] References Cited
U.S. PATENT DOCUMENTS

| | | | |
|---|---|---|---|
| 3,628,059 | 12/1971 | Niu | 307/359 |
| 3,851,259 | 11/1974 | Porawski | 307/360 |
| 4,939,750 | 7/1990 | Nakamura | 307/359 |
| 4,975,657 | 12/1990 | Eastmond | 307/358 |
| 5,146,223 | 9/1992 | Muto | 341/115 |

Primary Examiner—Timothy P. Callahan
Assistant Examiner—Shawn Riley
Attorney, Agent, or Firm—Mark A. Navarre

[57] ABSTRACT

A digital equivalent of a periodic analog signal is generated in a manner substantially insensitive to variations in the reference about which the analog signal oscillates by switching the digital equivalent between high and low levels based on reference voltages derived from the peaks and valleys of the analog signal. The manner of generating the digital equivalent is substantially insensitive to common mode noise across the analog signal generator by locking a differential signal output when significant common mode noise in sensed. Generator faults are also diagnosed.

9 Claims, 4 Drawing Sheets

ANALOG TO DIGITAL SIGNAL CONVERSION

FIELD OF THE INVENTION

This invention relates to signal conditioning circuitry and, more specifically, to a method and apparatus for conditioning an analog signal for use by a digital controller.

BACKGROUND OF THE INVENTION

Sensors are in conventional use for measuring the angular rate of rotation of wheels or gears. Such sensors generate an analog signal, substantially sinusoidal, with a frequency proportional to the angular rate. Representative of these sensors is the well-established variable reluctance sensor that measures the rate of change in flux as appendages such as teeth on the wheel or gear pass the sensor. Ideally, the rate of change in flux over time is sinusoidal and is centered around a fixed reference voltage.

Applications of such sensors are widespread in the automotive field, where sensors are used to measure the rate of rotation of the crankshaft or camshaft of the vehicle engine, or may be used to measure the rate of rotation of the vehicle wheels. As such vehicles typically employ digital controllers, any wheel speed information of interest to the controller must by converted to digital form.

The typical digital controller will require a binary substantially square wave signal within some predetermined voltage range, such as zero to five volts. Of course, the frequency of the digital signal should be proportional to the frequency of the analog signal from which it was generated. Furthermore, it is desirable to maximize resolution of the signal, which is provided by approaching a 1:1 ratio between the analog and digital signal frequencies.

Converters are available commercially that compare the analog signal to fixed voltage thresholds and switch the digital equivalent between its binary levels when the analog signal crosses the thresholds. Such systems may reliably generate a digital equivalent of the analog signal in the ideal case, such as when the analog signal is centered around a fixed reference voltage, but when the signal drifts, for instance when the a.c. components of the signal are not centered around a fixed voltage level, such as zero volts, the system may miss one or many oscillations of the signal. The reference of the analog signal may vary so much as to take the entire signal outside the fixed threshold voltage range, so that the circuit does not see a crossing of the thresholds and consequently does not switch the digital equivalent.

As described, the output of an ideal variable reluctance sensor is sinusoidal and is centered around a fixed reference voltage. Practically however, sensors may deviate substantially from the sinusoidal model, and may be centered around a reference that varies significantly and unpredictably. So great may be the variation in the reference voltage that the sensor output oscillations may not cross a fixed reference relied on in a conventional digital converters. As such, analog oscillation information will be lost and the digital signal generated by the converter will be less accurate. Variations in the reference voltage may result from a wheel or gear that does not rotate about its center, or from teeth that fluctuate in size. Such defects may not be easy to diagnose, and may not be easily or inexpensively repaired.

Accordingly, what is needed is a method and apparatus for converting the analog output of a wheel or gear speed sensor to a digital value that is usable by a digital controller and that is insensitive to the unpredictable variations in the reference voltage of the analog signal.

SUMMARY OF THE INVENTION

The present invention overcomes the shortcomings of the prior art by providing a method and apparatus for converting an analog waveform to a digital representation with digital switchpoints determined not from analog signal crossings of fixed voltage thresholds, but from analog crossings of variable thresholds. The variable thresholds are determined from the analog signal itself, generally as the present maximum or minimum peak of the analog signal less a predetermined offset voltage.

A deadband circuit receives a sensor signal from signal conditioning circuitry which may include voltage range limiting circuitry, circuitry to reduce the effect of common mode noise, or diagnostic circuitry. The deadband circuit detects signal peaks and valleys and holds its output constant just after the peak or valley passes. The output is held while the analog signal passes through a deadband, after which the output is released to change in inverse proportion to the analog signal until a valley is detected, after which the output is held again.

The output of the deadband circuit is provided to a hysteresis circuit, which compares the conditioned analog signal to the sum of a value proportional to the deadband circuit output and a predetermined voltage, and switches its output between high and low digital levels when the two compared signals cross. The output of the hysteresis is a substantially square wave signal having a frequency proportional to the rotation rate of the wheel. The circuitry in accord with the present invention is not sensitive to the stability of the reference of the analog signal as the reference is simply ignored in generating the digital equivalent. Rather attention is focused on an amount of change in voltage magnitude from the peaks and valleys of the signal.

BRIEF DESCRIPTION OF THE DRAWINGS

The invention may be best understood by reference to the following description of a preferred embodiment and to the drawings in which.

DESCRIPTION OF A PREFERRED EMBODIMENT

Figure 1:
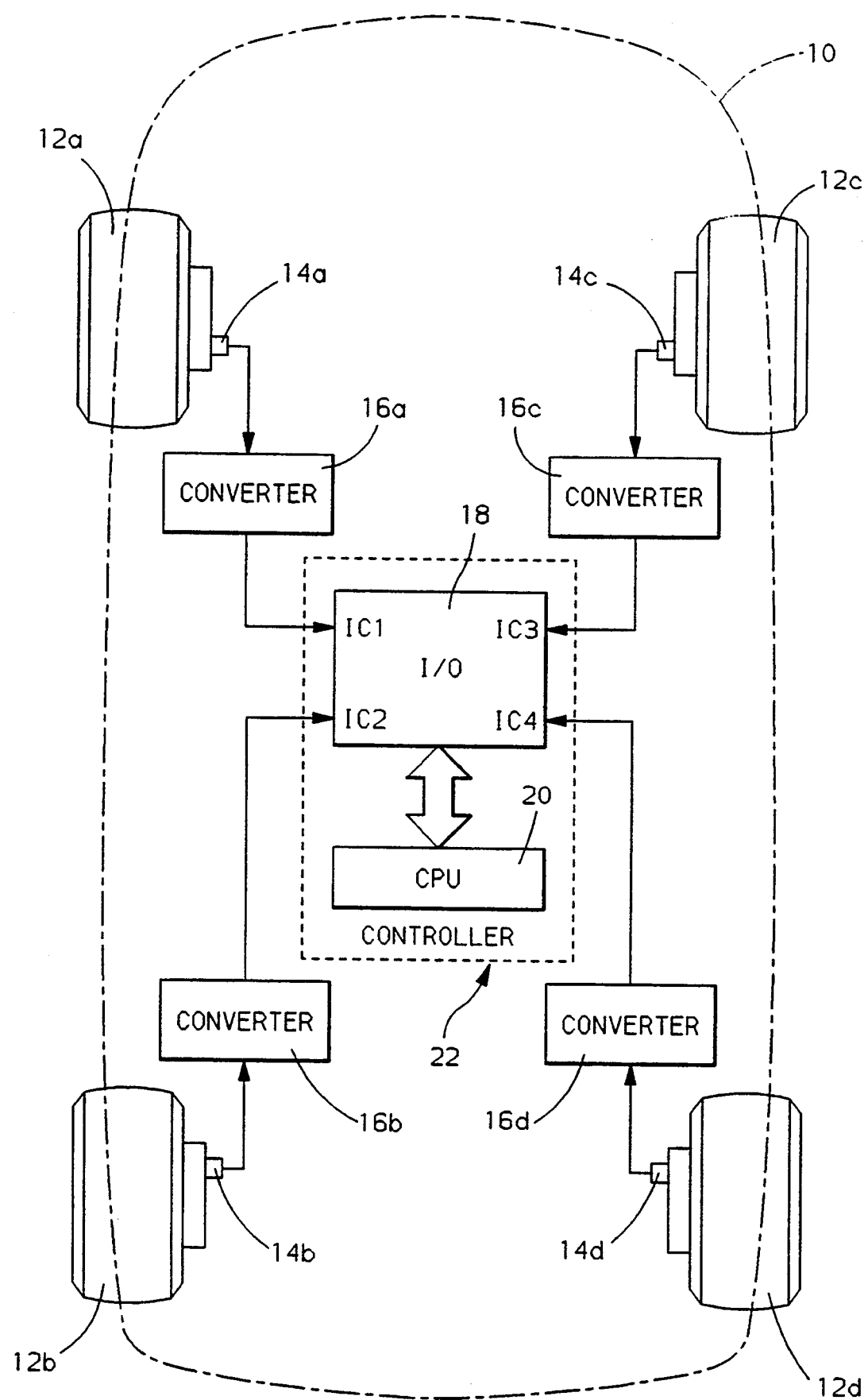
FIG. 1 is a general hardware diagram of an embodiment of this invention wherein the analog outputs of each of four wheel speed sensors are converted to digital form using the conditioning circuitry of the preferred embodiment.

Referring to FIG. 1, an automotive vehicle 10 is outlined with four wheels $12a$–$12d$, each wheel having a respective conventional wheel speed sensor $14a$–$14d$, such as a variable reluctance sensor that measures the rate of change in flux as appendages such as teeth on each wheel pass the sensor. The output of each of the sensors $14a$–$14d$ is proportional to the rate of change in flux measured by that sensor, is substantially sinusoidal for a moving wheel, and is communicated to a respective converter 16a–16d, which generally conditions the sinusoidal signal and outputs a digital equivalent to a respective input capture port IC1–IC4 of a conventional input/output I/O section 18 of a vehicle controller 22.

The frequency of each of the four digital signals received by the I/O section is proportional to the speed of each of the respective four wheels. In a conventional manner, the four input capture ports may count the rising or falling edges of the received digital signals and store the count in controller memory (not shown) for access by the central processing unit CPU 20 for conversion to a measurement of the speed of the four wheels. The wheel speed information thus provided may be used for any one of a variety of applications well known in the art of vehicle control.

While the diagram of FIG. 1 illustrates signal conversion of wheel speed information from all four wheels of the vehicle, it should be noted that the inventors do not intend that the signal conditioning and conversion of this invention be limited to such applications. Rather, the principles of this invention may be applied to any subset of the four wheels in a wheel speed sensing application, or may be applied to other analog outputs of sensors on the vehicle, such as crankshaft or camshaft rotation sensors. Generally, the signal conditioning and conversion of this invention may be applied to generate a digital representation of any analog periodic signal on a vehicle.

Figure 2A:
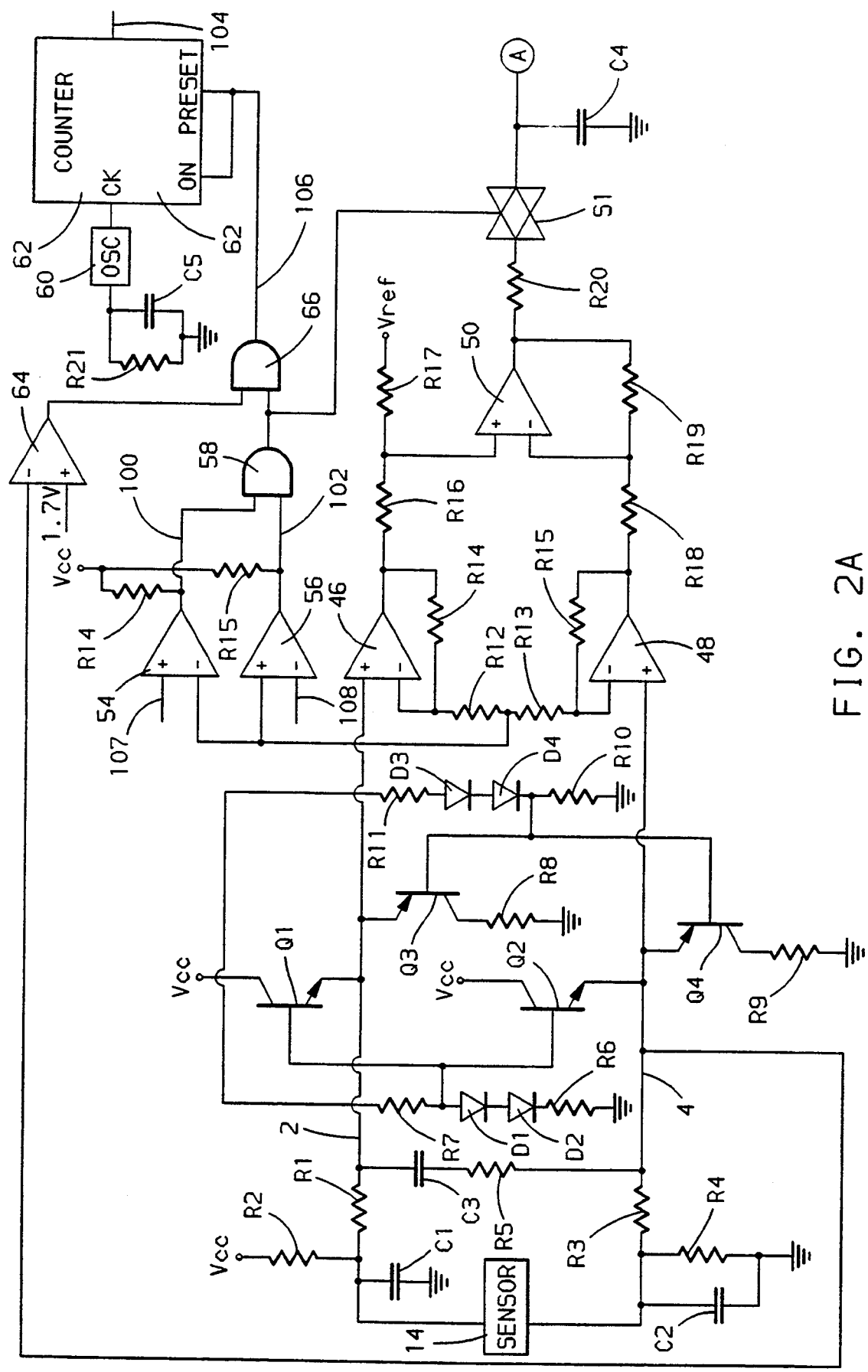
FIGS. 2a and 2b are general schematics of circuitry used to condition an analog signal and generate a digital representation thereof in accord with this embodiment.
Figure 2B:
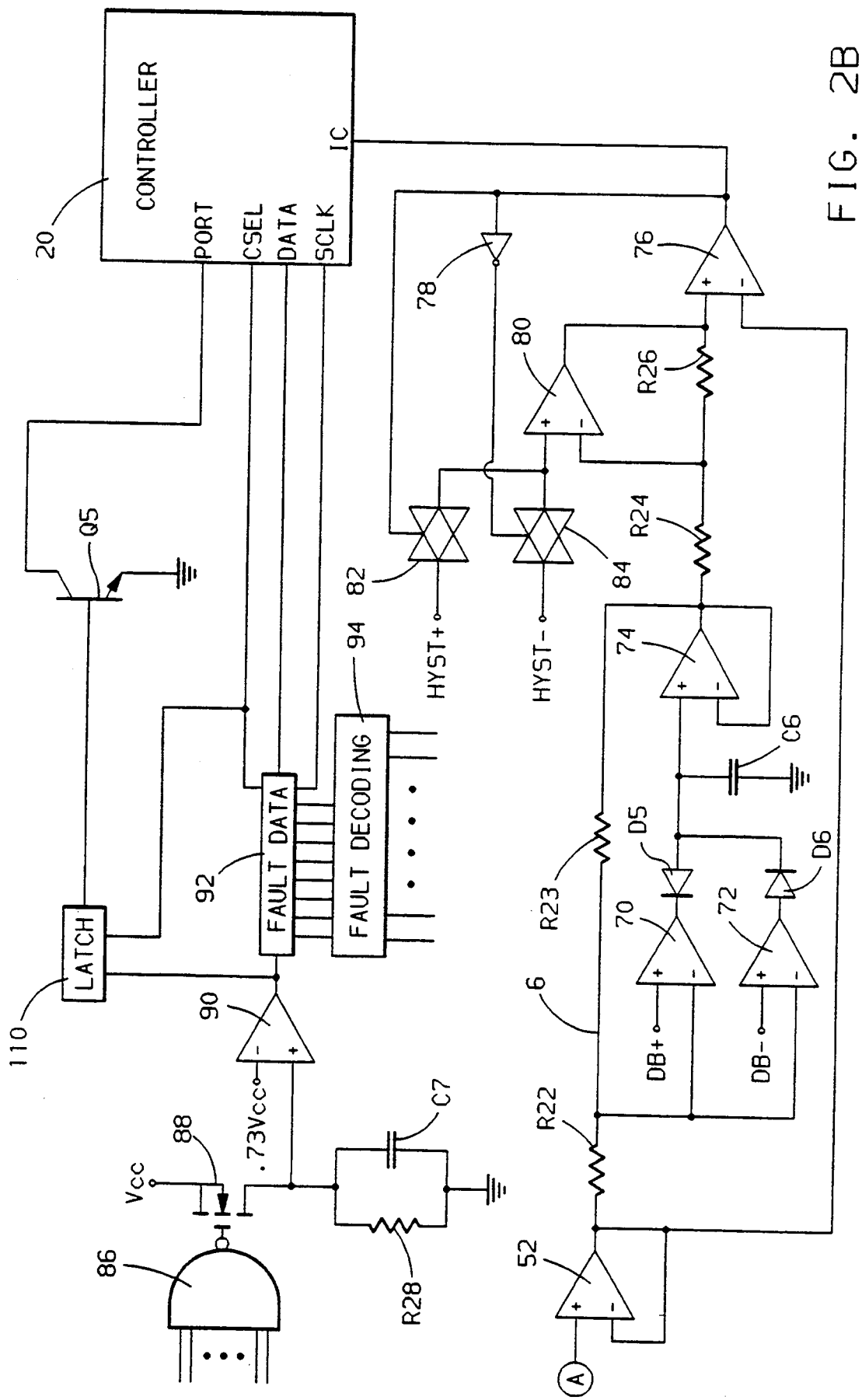

FIGS. 2a and 2b illustrate the circuitry of one of the converters 16a–16d (FIG. 1), its connection to a variable reluctance sensor 14 from the group 14a –14d (FIG. 1), and its connection to the controller 20. Specifically in FIG. 2a, conventional variable reluctance sensor 14 is biased by pulling its high side up to supply voltage Vcc through resistor R2, and pulling its low side to ground voltage (ground) through resistor R4. High frequency noise is shorted to ground on both the first and second terminals of sensor 14 via capacitors C1 and C2, respectively, consistent with well-known noise filtering practice.

The first terminal of sensor 14 is connected through resistor R1 to the non-inverting input of op-amp 46. The second terminal is connected to non-inverting input of op-amp 48 through resistor R3. The pair of resistors R1 and R3 along with shunt combination resistor R5 and capacitor C3 provide a low pass filter through which the sensor signal passes. This filter is conventionally used with variable reluctance sensors which have the well-known characteristic of an output magnitude proportional to the frequency of the wheel being sensed. The low pass filter operates not only to block passage of high frequency signals (noise) to later stages of the circuit of FIGS. 2a and 2b, such as signals above 2000 Hz, but also reduces the sensor amplitude with frequency to mitigate against the wheel speed related changes in sensor output amplitude. For instance, the filter may attenuate signals above 500 Hz by an amount proportional to signal frequency.

The sensor bias provides that if the high or low side of the sensor 14 is in an open circuit condition, the low side will drop to ground and remain there as long as the condition persists. To detect this open circuit condition, circuit elements 60–66 are provided in the configuration shown. Specifically, the inverting input of comparator 64 is connected to low side of sensor 14 through resistor R3, and the non-inverting input of comparator 64 is connected to a fixed reference voltage, such as 1.7 volts in this embodiment. Comparator output is connected as one input to conventional two input AND gate 66. The other input to AND gate 66 is line 106, which is connected to the output of AND gate 58. AND gate 58 provides a diagnostic indication that is set low when either of two sensor short circuit conditions are detected, as will be described.

Accordingly, when the inverting input drops below 1.7 volts, the comparator output goes high and, if line 106 is high, the output of the AND gate will be set high enabling counter 62, which is a divide-by-31 counter in this embodiment. AND gate 66 thus not only conditions the signal to be read by the counter 62, but, via line 106, prevents the counter from being enabled when a sensor short has been detected, as the circuit otherwise might improperly diagnose a short condition as an open sensor condition.

If the output of AND gate 66 is low, the preset input to the counter is active, keeping the counter effectively disabled. Once enabled from a high output from AND gate 66, the counter moves through its counting states at its clock frequency, set by the output of oscillator 60. After 31 clock cycles, the counter 62 will overflow, setting output line 104 low (active). The low output indicates an open sensor condition, and may be input to NAND gate 86 and fault decoder 94, to be described.

The oscillator frequency is set by selecting appropriate values for R21 and C5 to ensure that sensor transients that drop below 1.7 volts are not diagnosed as open sensor faults. For example, the voltage induced across a conventional variable reluctance sensor is proportional to change in flux. Flux changes more rapidly if the tooth on the toothed wheel passes by the sensor more rapidly. Accordingly, the peak to peak voltage magnitude induced across the sensor will increase at higher wheel speeds, increasing the potential for the signal to drop below the 1.7 volt threshold needed to start the counter 62. The values of R21 and C5 should be set for a given application to avoid diagnosing the low voltage peaks, or decreases in the reference of the waveform generally, as open circuits.

The voltage on line 2 and on line 4 must be limited or clamped before being input to the amplifiers used in the circuit of FIGS. 2a and 2b (to be described), to protect the amplifiers from overvoltage and to ensure that the amplifiers behave in a predictable manner. In this embodiment, lines 2 and 4 are limited to a minimum voltage of approximately one volt and a maximum of approximately four volts. The one volt limit is provided by setting the base of transistors Q1 and Q2 to slightly more than one volt, via the voltage divider including R7, D1, D2, and R6, wherein the resistance of R7 and R6 are set appropriately, using circuit design practice generally known in the art.

Accordingly, when the voltage on line 2 is less than approximately one volt, Q1 turns on and limits the voltage on line 2 to the base voltage of Q1 (less the minor voltage drop across the base-emitter junction). Likewise, when the voltage on line 4 drops below approximately one volt Q2 turns on, limiting the voltage on line 4 to slightly less than the base voltage-approximately one volt.

The four volt limit is provided in an analogous manner by setting the base of Q3 and Q4 to slightly less than four volts via the divider including R11, D3, D4, and R10 which may be appropriately selected to ensure that the drop across R10 is just over four volts. Thus, when line 2 increases to approximately four volts, Q3 will turn on and limit the emitter voltage to a voltage slightly greater than the base voltage of just under four volts. Likewise, when line 4 increases to approximately four volts, Q4 will turn on and limit the voltage on line 4 to substantially four volts.

The clamped voltages on line 2 and 4 are next input to a conventional three amplifier instrumentation amplifier circuit. As is well-known in the art of instrumentation amplification, the first stage of the amplifier including op-amp 46 and op-amp 48 provides a differential output with a high differential gain set by the value of R12 and R13, each of which is of substantially the same resistance, which is provided to the next stage of the amplifier, a conventional differential amplifier 50 which amplifies the difference in the signals at its input terminals with a gain of one.

The output of the amplifier is provided to an R-C filter including resistor R20 and capacitor C4. A normally open switch S1 is interposed between R20 and C4. First-order R-C filtering of the output of the instrumentation amplifier is provided as is generally understood in the art when S1 is closed. However, when S1 is open, capacitor C4 holds the output voltage of the amplifier—there is no path by which the capacitor C4 may discharge. S1 is controlled by a common mode noise lockout circuit including AND gate 58, and comparators 54 and 56 which form a window comparator to be described.

The common mode noise lockout circuit "locks" the output of the instrumentation amplifier when common mode noise causes the differential signal at the first stage of the instrumentation amplifier to exceed the input common mode range. Such common mode noise can occur with variable reluctance sensors, and can cause misleading instrumentation amplifier outputs. For instance, the amplifier output can be driven to a voltage limit, such as the Vref of the conventional instrumentation amplifier, when both amplifier inputs are pushed to a common high or low voltage limit. This embodiment addresses these concerns by locking out such potentially misleading amplifier outputs.

Specifically, the voltage signal between R12 and R13, which is the bias voltage of the differential signal of the first stage of the instrumentation amplifier, is input to the inverting input of comparator 54, and to the non-inverting input of comparator 56. In this embodiment, the inputs will indicate an excursion out of the common mode range when the bias voltage of the differential signal is greater than approximately 3.3 volts or is less than approximately 1.7 volts.

Input 107 of the non-inverting terminal of op-amp 54 is thus set at 3.3 volts, such that the output of op-amp 54 will be low when the bias voltage exceeds 3.3 volts forcing the output of AND gate 58 low, opening conventional switch S1, and locking the amplifier output by not allowing capacitor C4 to charge or discharge. Likewise, the inverting input 108 to comparator 56 is set to approximately 1.7 volts, whereby the comparator 56 output will be low when the bias voltage drops below 1.7 volts, driving the output of AND gate 58 low, opening switch S1, and locking the amplifier output, as described. Beyond being communicated to switch S1, the output of AND gate 58 is provided as an input to AND gate 66, via the described line 106.

When the bias voltage indicates that the inputs are within their common mode input range, the outputs of comparators 54 and 56 will be high, pulled up via respective pull-up resistors R14 and R15. Thus the output of AND gate 58 will be driven high, closing switch S1, and thereby allowing the output of the amplifier to vary with the differential input voltage.

The output of the instrumentation amplifier, whether locked out by switch S1 or not, is next passed through a conventional voltage follower 52, acting as an impedance buffer, to a deadband circuit consisting of three amplifiers 70, 72, and 74, two resistors R22 and R23, two diodes D5 and D6, and a capacitor C6. In general, the deadband circuit compensates for drift in the reference voltage around which the amplified sensor voltage swings. As discussed, the signal reference can vary significantly. Conventional systems that attempt to derive digital representations of the signal compare the signal to fixed thresholds to determine whether it may be modeled as being in a high or low digital state. When the reference drifts from a modeled reference, these traditional systems may lose critical information on the nature of the sinusoidal sensor signal.

The deadband circuit establishes voltage levels on which output switching threshold voltages are based. These levels are not fixed, but are based on the sensor output signal itself. For instance, while the sensor signal is increasing above an upper threshold voltage, the deadband circuit output voltage is decreasing proportionally. The upper threshold voltage is the difference between a fixed voltage and a value proportional to the output voltage. Accordingly, when the sensor signal is increasing, the output voltage is decreasing, increasing the upper threshold voltage. When the substantially sinusoidal sensor signal reaches its peak and starts to decrease, the peak is detected by the proportionally large upper threshold voltage as will be described, and the output is held constant until the sensor signal decreases below a lower threshold voltage.

The lower threshold voltage is the difference between a fixed voltage and a value proportional to the deadband circuit output voltage. While the sensor signal is decreasing below the lower threshold voltage, the output voltage is increasing proportionally, decreasing the lower threshold voltage. When the sensor signal reaches its valley and starts to increase, the valley is detected by the proportionally small lower threshold voltage as will be described, and the output is held constant until the sensor signal increases once again above the upper threshold voltage, as described.

Specifically in FIG. 2b, the output of buffer 52 passes through resistor R22 to the node marked 6 and is input to an inverting input of conventional operational transconductance amplifier OTA 70, and to an inverting input of conventional operational transconductance amplifier OTA 72. The outputs of the OTA 70 and OTA 72 are tied to a common side of capacitor C6 the opposite side of which is grounded. OTA 70 may be described as a "sink" OTA as diode D5, placed in series with its output, only allows the OTA 70 to sink current from capacitor C6—otherwise it is reverse biased. Likewise, OTA 72 may be described as a "source" OTA as diode D6, placed in series with the OTA output, only allows the OTA 72 to source current to capacitor C6—otherwise it is reverse biased.

The output of sink OTA "sinks" current from the capacitor C6 at a rate proportional to the potential difference at its input pins. The diode D5 prevents its output from sourcing current from the capacitor C6. Therefore, as is generally understood in the art of circuit design, sink OTA 70 can only compensate for the input condition wherein the potential at its inverting input (node 6) increases above the potential at its non-inverting input, which is fixed at DB+, to be described.

The output of source OTA 72 on the other hand will source current to the capacitor C6 when the voltage at its inverting input (node 6) decreases below the voltage at its non-inverting input, which is fixed at DB−, to be described. The voltage Vcap across the capacitor C6 is passed through voltage follower buffer 74, which prevents external loading on capacitor C6. The output of buffer 74 is fed back to node 6 via resistor R23. Accordingly, using well-known circuit analysis principles with a ratio R22/R23 of 5/4, the voltage Vx at node 6 may be expressed as $$Vx = 4Vs/9 + 5Vcap/9 \tag{1}$$

where Vs is the amplified sensor output signal from the output of buffer 52. Accordingly, as described, sink OTA 70 will sink current from capacitor C6 when $$4Vs/9 + 5Vcap/9 > DB+ \tag{2}$$

and source OTA 72 will source current into capacitor C6 when $$4Vs/9 + 5Vcap/9 < DB-. \tag{3}$$

The rate at which current sinks from or sources to the capacitor C6 is proportional to the potential difference between the OTA inputs according to the following equation $$i = gm(e2 - e1) \tag{4}$$

where i is the sink or source current, gm is the transconductance gain, set in a manner well-known in the art to provide stable, predictable capacitor charging, e2 is the potential at the non-inverting input to the OTA, and e1 is the potential at the inverting input. The OTA reference voltages DB+ and DB− may be set to 2.6 volts and 2.4 volts, respectively.

Functionally, when Vs, the signal from the output of buffer 52 increases sufficiently, such as near its peak such that $4Vs/9 + 5Vcap/9$ is greater than DB+ per equation (2), the sink OTA 70 will sink current from the capacitor C6 at a rate proportional to the changing potential between the inputs of OTA 70 according to equation (4). The sink of current will decrease Vcap proportionately, which will decrease, or at least reduce the increase of Vx, the described voltage at the OTA inverting inputs, per equation (1). When Vs reaches its peak, and starts to decrease in magnitude, both components of Vx in equation (1) will be decreasing contemporaneously, causing Vx to rapidly drop in magnitude below DB+, at which time OTA 70 will stop sinking current from capacitor C6.

As DB− is significantly less than DB+, Vcap will remain constant while Vx is between DB+ and DB−, the voltage "deadband." Accordingly, the only component of Vx that changes while Vx is in the deadband is Vs, which is decreasing in magnitude. When Vs decreases to the extent necessary to reduce Vx below DB− according to equations (1) and (3), the source OTA 72 will start sourcing current into capacitor C6, proportionally increasing Vcap which, through feedback resistor R23, will add to Vx, mitigating the decrease in Vx caused by the decreasing Vs. When Vs moves through its valley and starts to increase in magnitude, both components of Vx in equation (1) will be increasing contemporaneously, rapidly increasing Vx to a magnitude above DB−, so that shortly after the valley of Vs is reached, Vcap will no longer receive source current from OTA 72. Vx will then be in the described voltage deadband in which Vcap is held constant until Vx again swings up to a value above DB+, as described.

The resulting signal Vcap, which is passed to the next phase of the circuit of FIG. 2b through buffer 74, gradually moves between high and low hold voltages based on the peaks and valleys of the sensor signal Vs, not based on any fixed threshold. The peaks and valleys need not be centered around a fixed reference voltage, but can swing significantly above and below modeled limits and still be detected by the deadband circuit. For instance, a significant peak increase in Vs will be appropriately compensated by a proportionally decreased Vcap so that shortly after the peak, Vx will still cross DB+, deactivating sink OTA 70. Likewise, a significant decrease in the valley of Vs will be appropriately compensated by a proportionally increased Vcap so that shortly after the valley, Vx will still cross DB−, deactivating source OTA 72.

As discussed, Vcap is passed through buffer 74 to the next phase of the circuit of FIG. 2b, called the hysteresis stage, consisting of, in this embodiment, resistors R24 and R26, amplifier 80, comparator 76, inverter 78, and two analog switches 82 and 84. Vs, the amplified sensor output signal from the output of buffer 52 is also input to the hysteresis stage. Generally, the hysteresis stage compares Vs to the difference between a constant voltage and the deadband circuit output and thereby generates a squared signal recognizable by the digital controller 20, with a frequency representative of the rotational speed of the toothed wheel, such as one of the toothed wheels 16a–16d of FIG. 1.

The output signal from comparator 76 of the hysteresis circuit is passed to a digital processor port capable of interpreting the signal. For instance, with the wheel speed sensor of this embodiment, such port must be capable of determining the frequency of the signal, which is representative of the angular rate of the wheel. In this embodiment then, the port is an input capture port, which is known generally in the art as a port that may be configured to detect signal edges or levels and provide certain servicing functions upon receiving such levels or edges. For example, the controller 20 may be software configured to generate an interrupt when an appropriate rising or falling edge is detected at the input capture port or when a high voltage level is detected. On the interrupt, a service routine may store the time of the interrupt and reset the interrupt for the next like event. Another routine may then process the interrupt times to determine the frequency of the square wave signal and thus the wheel angular rate. The use of wheel angular rate information is well known in the art of engine control. For instance, it may be communicated to a speedometer or odometer, or it may be used in conventional anti-lock brake control, traction control, or vehicle speed control.

Returning to FIG. 2b, aside from being communicated to controller 20, the output of comparator 76 is provided to conventional digital inverter 78, which inverts the signal and provides the inverted signal to the control input of analog switch 84. The comparator output signal is directly provided (in uninverted form) to the control input of analog switch 82. The operation of analog switches 82 and 84 is well-known in circuit design: if the control input is high, the switch will close and the input will be passed to the output; otherwise the switch will be open.

Accordingly in FIG. 2b, if comparator 76 output is high (greater than approximately 3 volts), switch 82 will close and switch 84 will be open (as its input from the digital inverter 78 is low) and voltage HYST+ will be input to the non-inverting terminal of amplifier 80. Alternatively, if comparator output is low, switch 82 will be open, and switch 84 will be closed and voltage HYST− will be input to the non-inverting terminal of amplifier 80. HYST+ and HYST− are set to provide a hysteresis voltage range centered within the deadband voltage range defined by DB+ and DB−, wherein the magnitude of the hysteresis range is roughly 85 percent of the magnitude of the deadband range. As will be apparent to one with ordinary skill in the art of circuit design after a full description of the hysteresis circuit, if the hysteresis range exceeds the deadband range, the output of comparator will not switch. Accordingly, to account for offsets in the circuitry that cannot be modeled, the hysteresis range is set an amount less than the deadband range. For example, in this embodiment, DB+ and DB− were described as being set as 2.6 and 2.4 volts respectively. Accordingly, HYST+ is set to approximately 2.585 volts and HYST− is set to approximately 2.415 volts.

Returning to the hysteresis circuit, the output Va of amplifier 80 may be expressed as follows $$Va = 9Vh/4 - 5Vcap/4 \quad (5)$$

where Vh is the voltage input to the noninverting terminal of amplifier 80 and Vcap is the output of buffer 74 (the voltage across capacitor C6). Accordingly, as illustrated in FIG. 3, the comparator 76 output will switch from low to high when $$9(HYST-)/4 - 5Vcap/4 > Vs. \quad (6)$$

Figure 3:
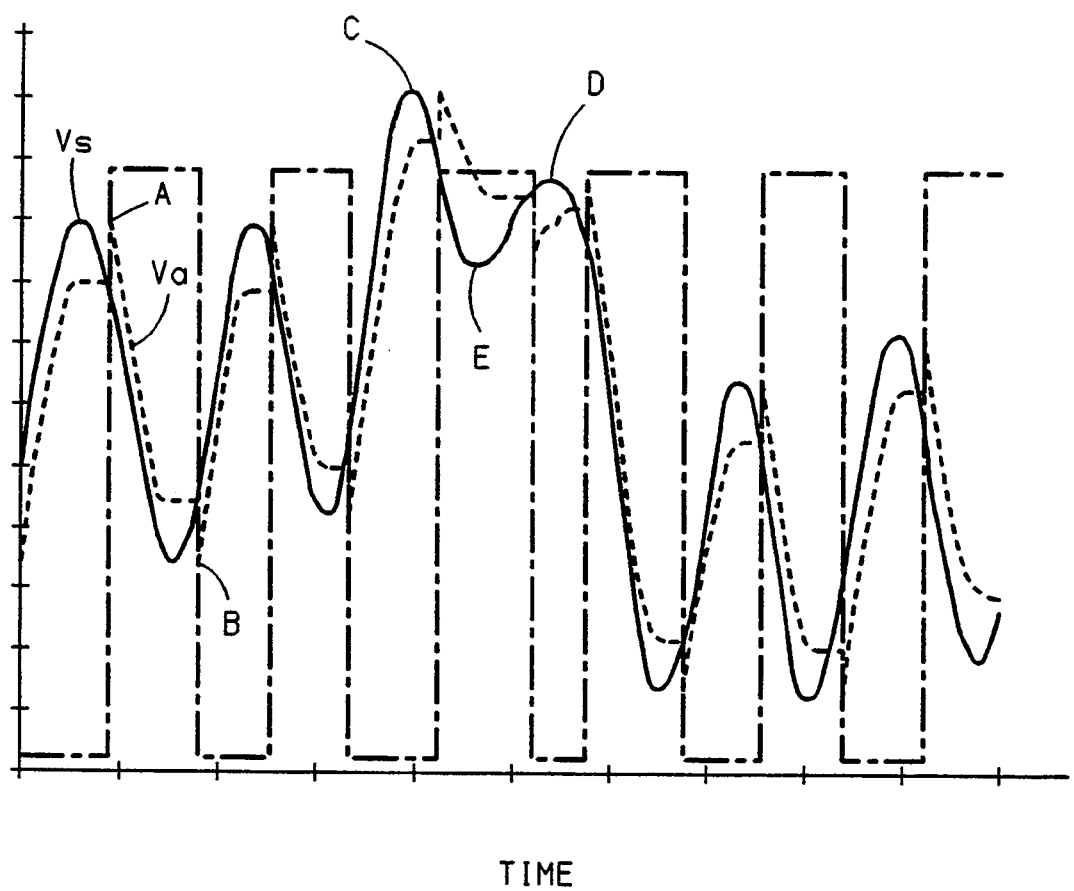
FIG. 3 is a diagram illustrating various signals generated by certain stages of the circuit of FIGS. 2a and 2b.

When the comparator output switches high, HYST+ will be substituted for HYST− in equation (6), increasing Va of equation (5), for example as shown in FIG. 3 at point A, providing that the next comparator output switch will occur a significant time after the next valley of Vs, when Vs rises above Va, for example at point B in FIG. 3. At point B, HYST− will be substituted for HYST+ allowing for the next switch to occur a significant time after the next peak of Vs. The substitution of hysteresis voltages in the switching determination changes Va in direction to be symmetrical around Vs, so a substantially square wave may be produced by the comparison of the two signals.

As shown in FIG. 3, the signal from sensor 14 (FIG. 2a) may not center around a fixed reference. The perturbation in the signal of FIG. 3 resulting in increased peaks C and D, and in increased valley E, is typical of that caused by a short tooth on the wheel that rotates in proximity to sensor 14. The range of the signal over one such signal period, such as from C to E to D in FIG. 3, may not cross a fixed threshold voltage, such as that provided in the above-described prior art systems, and thus may not be detected.

However, in accord with this invention, Va tracks the varying magnitude of the peaks and valley and, due to the deadband circuitry generating an output related to the peak and valley of the signal, and due to the provision of a threshold based on the deadband output, the crossing of Vs and Va provides a reliable indication of those peaks and valleys.

In this embodiment, fault detection circuitry may be provided with the circuitry of FIGS. 2a and 2b. Information on whether the variable reluctance sensor is open-circuited, shorted to ground or shorted to the supply, such as the vehicle battery (not shown) are available with the described circuitry of FIGS. 2a and 2b. As detailed, the output line 104 of the divide-by-31 counter 62 is low when an open-circuited sensor has been detected. Further, the outputs 100 and 102 of window comparator are low respectively when a short to supply is detected and when a short to ground is detected.

Lines 100–104 detail fault detection outputs for the wheel speed sensing circuitry of FIGS. 2a and 2b for a single vehicle wheel. However, in this embodiment, three like outputs may be generated for any of the remaining wheels. For instance, twelve outputs detailing specific fault information for all wheels of a four wheel vehicle may be generated by providing the above-described circuitry of FIGS. 2a and 2b to each of the wheels of a four wheel vehicle.

To process these outputs, all twelve outputs are provided as inputs to a conventional NAND gate 86 and to fault decoding block 94. If at least one of these outputs is low (active), the output of NAND gate 86 will be high, turning off FET 88. Capacitor C7 will then discharge through resistor R28 pulling the non-inverting input of comparator 90 below the inverting input, set at 0.73*Vcc, after a short delay such as 75 microseconds in this embodiment, driving comparator output low in a manner generally known in the art of circuit design.

The low output of comparator 90 is provided to fault data transmission block 92 to trigger communication of the fault to controller 20. The delay provided by the R-C circuit including R28 and C7 acts as a filter to prevent short duration voltage glitches which may have driven the output of gate 86 high from moving further through the circuit of FIG. 2b. The output of comparator 90 is also provided as an input to latch 110, which may for example be a conventional D flip flop. A low input to latch 110 drives its output high, turning on transistor Q5, pulling the collector of Q5 low. The collector of Q5 is read by a controller port, for example where the port is software readable as an address in controller memory. If the collector is low, the port will appear as a logic "0" which indicates a fault in the wheel speed sensing circuit, as described. Otherwise, the port will read as a logic "1", indicating no such fault.

Returning to the AND gate 86, if the fault indications input to the gate are all high (inactive), the gate output will be low, FET 88 will be on, keeping comparator 90 output high, indicating to fault data transmission block 92 that no fault data is available for communication to controller 20, and Q5 will output a high (inactive) signal to controller 20.

The fault decoding block 94 may be used to convert the data input to it to a form communicable to controller 20 such as a multiplexed byte of data representative of the state of its inputs. This multiplexed byte may then be input to the fault data transmission block 92. When the output of comparator 90 is low, the controller 20 will read the port as low. In a well-known manner, such as that used for the serial peripheral interface of the Motorola eight-bit processor family (for example the MC68HC11 controller), the controller may then send a chip select signal to block 92 to prepare for the start of communication of the fault information. The controller may then send out clock pulses to block 92 which will trigger bit by bit serial communication of the fault information to controller 20.

When communication is complete, the chip select line will drop low. The chip select line is also input to the conventional reset input of latch 110, such that the falling edge of the chip select signal will reset the latch 110, and thereby allow it to clear the port and wait for any future fault information that may again set the latch. The controller may, after receiving the data, demultiplex it to resolve the type of fault sensed, and the wheel at which it was sensed. Action may then be taken on the fault, such as by logging information on the fault in non-volatile memory (not shown), so that further information from the associated sensor may be ignored until serviced.

The description of a preferred embodiment for the purpose of illustrating the invention is not to be taken as limiting or restricting the invention since many modifications may be made by the exercise of skill in the art without departing from the invention.

The embodiments of the invention in which a property or privilege is claimed are described as follows:

1. A method for generating a digital representation of an analog signal that periodically fluctuates between maximum and minimum voltages comprising the steps of:

sensing a maximum voltage of the analog signal;
sensing a minimum voltage of the analog signal;
generating a limit signal which is fixed at an upper limit value determined in relation to said maximum voltage between the sensing of said maximum voltage and a point at which said analog signal thereafter falls by a predetermined amount, and at a lower limit value determined in relation to said minimum voltage between the sensing of said minimum voltage and a point at which said analog signal thereafter rises by said predetermined amount;
calculating a reference signal as a sum of a predetermined voltage and the generated limit signal; and
generating a digital signal having a high output level when the analog signal is less than the reference signal and having a low output level when the analog signal is greater than the reference signal.

2. The method of claim 1, wherein the predetermined voltage is a first predetermined voltage when the digital output is high and is a second predetermined voltage when the digital output is low.

3. A method of generating a digital representation of an analog voltage induced across first and second output terminals of a sensor, wherein the analog voltage periodically fluctuates between minimum and maximum voltages, comprising the steps of:

sensing first and second voltages at respective first and second output terminals of the sensor;
generating an analog output signal as a difference between a first amplified voltage, which is a predetermined function of the first voltage and a second amplified voltage, which is a predetermined function of the second sensed voltage;
comparing the first and second sensed voltages to a predetermined upper voltage limit and to a predetermined lower voltage limit;
prohibiting change in the magnitude of the generated analog output signal when the sensed voltage at the first and second terminals contemporaneously exceed the predetermined upper voltage limit;
prohibiting change in the magnitude of the generated analog output signal when the predetermined lower voltage limit contemporaneously exceeds the sensed voltage at the first and second terminals;
sensing a maximum voltage of the analog output signal;
sensing a minimum voltage of the analog output signal;
generating a limit signal that fluctuates between an upper and a lower voltage, wherein the upper voltage is a predetermined function of the sensed maximum voltage and the lower voltage is a predetermined function of the sensed minimum voltage;
calculating a reference signal as a sum of a predetermined voltage and the generated limit signal;
generating a digital signal having a high output level when the analog signal is less than the reference signal and having a low output level when the analog signal is greater than the reference signal.

4. The method of claim 3, further comprising the step of:

determining the rate at which the analog output signal moves between the sensed minimum and maximum voltages, and wherein the generating step generates a limit signal that fluctuates between the upper and lower voltages at a rate that is in predetermined proportion to the determined rate.

5. The method of claim 3, wherein the predetermined voltage is a first predetermined voltage when the digital signal is at a high output level and is a second predetermined voltage when the digital signal is at a low output level.

6. An apparatus for generating a digital representation of an analog voltage that periodically fluctuates between minimum and maximum voltages, comprising:

a sensor having first and second output terminals communicating respective first and second sensor output voltages;
a difference amplifier for generating an analog output signal as a difference between a first amplified voltage, which is a predetermined function of the first sensor output voltage and a second amplified voltage, which is a predetermined function of the second sensor output voltage;
means for comparing the first and second sensor output voltages to a predetermined upper voltage limit and a predetermined lower voltage limit;
means for holding the magnitude of the generated analog output signal at a substantially constant magnitude when the first and second sensor output voltages contemporaneously exceed the predetermined upper voltage limit;
means for holding the magnitude of the generated analog output signal at a substantially constant magnitude when the predetermined lower voltage limit contemporaneously exceeds the first and second sensor output voltages;
a peak detector for sensing a maximum voltage of the analog output signal;
a valley detector for sensing a minimum voltage of the analog output signal;
a signal generator for generating a limit signal that fluctuates between an upper and a lower limit, wherein the upper limit is a predetermined function of the magnitude of the sensed maximum voltage and the lower limit is a predetermined function of the magnitude of the sensed minimum voltage;

a signal summer for generating a reference signal as a sum of a predetermined voltage and the limit signal;

a comparator for comparing the analog output signal to the reference signal, wherein the comparator output is high when the analog output signal is less than the reference signal and the comparator output is low when the analog output signal is greater than the reference signal.

7. The apparatus of claim 6, further comprising:

a rate detector for detecting the rate of analog output signal variation between the sensed maximum and minimum voltages, and wherein the signal generator generates a signal that fluctuates between the upper and lower limits at a rate in predetermined proportion to the detected rate.

8. The apparatus of claim 6, wherein the predetermined voltage constant is a first predetermined voltage when the comparator output is high and is a second predetermined voltage when the comparator output is low.

9. The apparatus of claim 6, further comprising:

a pull-up resistor having a predetermined pull-up resistance, connected between the first output terminal and a predetermined supply voltage;

a pull-down resistor having a predetermined pull-down resistance, connected between the second output terminal and a predetermined ground voltage; and means for indicating an open sensor fault condition when a voltage in predetermined proportion to a voltage across the pull-down resistor is less than a fault threshold voltage for a predetermined period of time.

* * * * *